United States Patent [19]
Pascucci

[11] Patent Number: 5,867,504
[45] Date of Patent: Feb. 2, 1999

[54] SEMICONDUCTOR MEMORY DEVICE WITH ROW AND COLUMN REDUNDANCY CIRCUITS AND A TIME-SHARED REDUNDANCY CIRCUIT TEST ARCHITECTURE.

[75] Inventor: Luigi Pascucci, Milan, Italy

[73] Assignee: SGS-Thomson Microelectronics, S.r.l., Agrate Brianza, Italy

[21] Appl. No.: 869,367

[22] Filed: Jun. 5, 1997

[51] Int. Cl.[6] .................................................. G06F 11/00
[52] U.S. Cl. ......................................................... 371/10.3
[58] Field of Search ................................ 371/10.2, 10.3, 371/21.1; 365/201, 189.02, 230.02

[56] References Cited

U.S. PATENT DOCUMENTS

| | | | |
|---|---|---|---|
| 4,495,603 | 1/1985 | Varshney | 365/233 |
| 4,719,598 | 1/1988 | Stockton | 365/189 |
| 5,430,677 | 7/1995 | Fandrich et al. | 365/189.02 |

FOREIGN PATENT DOCUMENTS 0 702 373 A1   3/1996   European Pat. Off.   ........ G11C 29/00

*Primary Examiner*—Vincent P. Canney
*Attorney, Agent, or Firm*—David V. Carlson; Kevin S. Ross; Seed and Berry LLP

[57] ABSTRACT

A semiconductor memory device comprising redundancy memory elements for functionally replacing defective memory elements, redundancy circuits for operating said functional substitution of the redundancy memory elements for the defective memory elements, and operation mode control circuits for controlling the memory device to operate according to a plurality of operation modes, said plurality of operation modes comprising a memory read mode and redundancy test modes for testing the redundancy circuits. The memory device comprises an internal shared bus of signal lines that when the memory device is operated in said read mode is used to transfer read data signals to output terminals of the memory device and when the memory device is operated in one of said redundancy test modes is used to transfer redundancy signals, depending on the redundancy test mode, to the output terminals of the memory device.

18 Claims, 6 Drawing Sheets

SEMICONDUCTOR MEMORY DEVICE WITH ROW AND COLUMN REDUNDANCY CIRCUITS AND A TIME-SHARED REDUNDANCY CIRCUIT TEST ARCHITECTURE.

TECHNICAL FIELD

The present invention relates to a semiconductor memory device with row and column redundancy circuits and a time-shared redundancy circuit test architecture.

BACKGROUND OF THE INVENTION

It is known that semiconductor memory devices comprises a matrix of memory cells arranged in rows (word lines) and columns (bit lines).

It is also known that semiconductor memory devices conventionally incorporate row and column redundancy circuits for increasing the manufacturing process yield.

A row redundancy circuit is a circuit that detects if a current address supplied to the memory device corresponds to a defective row of the memory matrix containing one or more defective memory cells and, if so, selects a redundancy row of redundancy memory cells instead of the defective row.

Similarly, a column redundancy circuit is a circuit to detect whether the current address supplied to the memory device corresponds to a defective column of the memory matrix containing one or more defective memory cells and, if so, selects a redundancy column of redundancy memory cells in substitution of the defective column.

Normally, a certain number of redundancy rows and redundancy columns are provided in the memory device, said number depending on the defectiveness of the manufacturing process. The row redundancy circuit and the column redundancy comprise non-volatile memory registers (redundancy registers) each one capable of storing an address of a defective row or column and controlling the selection of an associated redundancy row or column when the current address supplied to the memory device coincides with one of said defective addresses. The provision of row and column redundancy circuits has a cost in term of chip area, the latter increasing with the increase of the number of redundancy memory elements provided in the memory device.

Some of the signals generated by the row and column redundancy circuits must be routed through the memory device chip. For example, for test purposes it may be useful to know how many and which redundancy rows and redundancy columns have been used to replace defective rows and columns. More particularly, it is important to have the maximum visibility of the redundancy circuits, for example when it is to be decided which redundancy registers are to be used to store defective addresses, during the debugging phase of the memory device, during reliability tests, for obtaining statistics of the defectiveness of the manufacturing process, for optimizing the number of redundancy memory elements to be provided, and for inspections after delivery of sold products. Conventionally, this requires routing redundancy row and column selection signals generated by the redundancy registers to the output terminals of the memory device chip.

The necessity to have many dedicated signal lines running through the chip is disadvantageous, especially in memory devices of large size, because the chip area increases and the benefit in term of yield of the manufacturing process is reduced.

SUMMARY OF THE INVENTION

In view of the state of the art described, it is an object of the present invention to provide a semiconductor memory device with row and column redundancy and a novel test architecture for testing the row and column redundancy circuits suitable to limit the number of dedicated signal lines which are to be provided in the memory device chip.

According to the present invention, such object is attained by means of a semiconductor memory device comprising redundancy memory elements for functionally replacing defective memory elements, redundancy circuits for operating said functional substitution of the redundancy memory elements for the defective memory elements, and operation mode control circuits for controlling the memory device to operate according to a plurality of operation modes, said plurality of operation modes comprising a memory read mode and redundancy test modes for testing the redundancy circuits, characterized by comprising an internal shared bus of signal lines that when the memory device is operated in said read mode is used to transfer read data signals to output terminals of the memory device and when the memory device is operated in one of said redundancy test modes is used to transfer redundancy signals, depending on the redundancy test mode, to the output terminals of the memory device.

According to a preferred embodiment, the semiconductor memory device comprises: a plurality of output data terminals; a matrix of memory cells arranged in rows and columns, said columns being grouped in a plurality of groups of columns of memory cells, each group of columns being associated to a respective output data terminal;

row and column selection means for selecting a row and a column in each group of columns, and sensing means for sensing memory cells belonging to a selected row and to the selected columns and generating read data signals; redundancy columns of redundancy memory cells for functionally replacing defective columns in said matrix; a column redundancy circuit for storing defective column addresses of defective columns and identifying codes suitable for identifying the groups of columns wherein the defective columns are located, for comparing said defective column addresses with a current column address supplied to the memory device and for generating redundancy column selection signals for selecting a redundancy column when the current column address supplied to the memory device coincides with one of said defective column addresses; redundancy rows of redundancy memory cells for functionally replacing defective rows in said matrix;
  a row redundancy circuit for storing defective row addresses of defective rows, for comparing said defective row addresses with a current row address supplied to the memory device and for generating redundancy row selection signals for selecting a redundancy row when the current row address supplied to the memory device coincides with one of said defective row addresses, characterized by comprising:
    a time-shared bus including a plurality of signal lines provided in the memory device for interconnecting a plurality of circuit blocks of the memory device and for transferring signals between said circuit blocks, the time-shared bus being selectively assignable to said circuit blocks in respective prescribed time intervals;
    first bus assignment means activated during a first time interval of an access cycle of the memory device for assigning the time-shared bus to the column redundancy circuit for transferring the identifying code of an addressed defective column from the column redundancy circuit to the output data terminals; and second bus assignment means for alternatively assigning the time-shared bus, during a second time interval of said access cycle, to said sensing means for transferring the read data signals to the output data terminals, to the column redundancy circuit for transferring the redundancy column selection signals to the output data terminals, or to said row redundancy circuit for transferring the row redundancy selection signals to the output data terminals, depending on an operation mode of the memory device.

Thanks to the adoption of a time-shared bus architecture, it is possible to greatly reduce the number of dedicated signal lines. The time-shared bus can be used not only to transfer signals during a normal reading operation of the memory device, but also to transfer signals in particular test modes, for example to transfer to the output data terminals of the memory device the redundancy row and column selection signals.

BRIEF DESCRIPTION OF THE DRAWINGS

These and other features and advantages of the present invention will be made more evident by the following detailed description of a preferred embodiment thereof, described as a non-limiting example in the accompanying drawings.

DETAILED DESCRIPTION OF THE INVENTION

Figure 1:
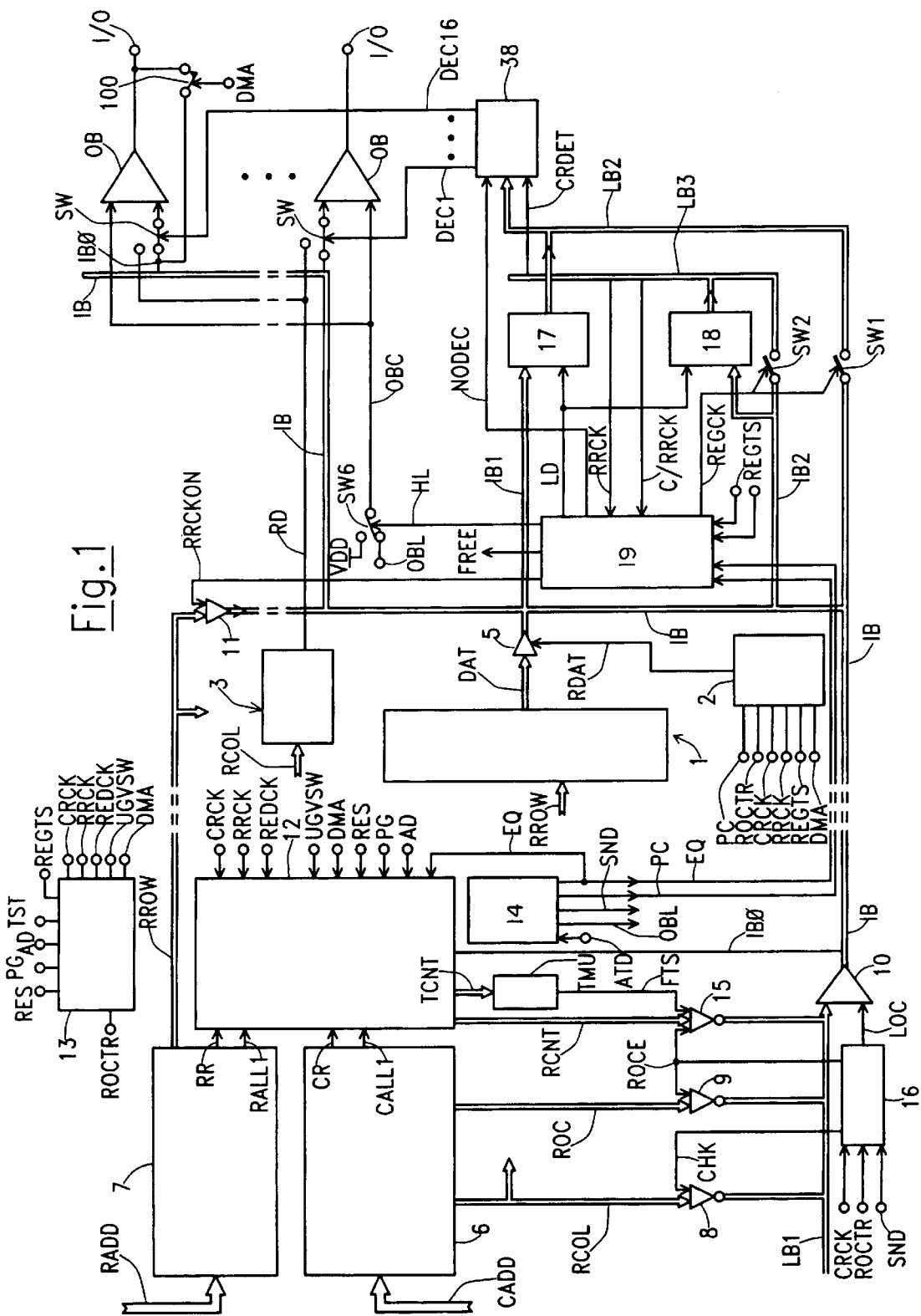
FIG. 1 is a schematic block diagram of a semiconductor memory device according to the present invention.

With reference to FIG. 1, the main circuit blocks of a semiconductor memory device according to the present invention are schematically shown. With the reference numeral 1 there is schematically indicated a circuit block of the memory device comprising a matrix of memory cells (memory matrix) with the associated address decoding and memory cell selection circuits and the associated sensing circuits for reading the information content of the selected memory cells. Conventionally, such a memory matrix 1 comprises rows (word lines) and columns (bit lines) of memory cells, and is divided in matrix portions, each matrix portion forming the memory space reserved to a respective bit of an output data word of the memory device. The memory matrix conventionally comprises redundancy rows of redundancy memory cells provided in the memory matrix for functionally substituting rows of the matrix containing defective memory cells.

A bus DAT comprising a number of signal lines equal to the output data word size of the memory device represents the output signals of the sensing circuits associated to the matrix of memory cells. Bus DAT can be interfaced with a general-purpose time-shared bus IB of signal lines by means of respective tri-state interface circuits 5 (one interface circuit for each signal line of bus IB), the activation thereof being controlled by a signal RDAT generated by a bus assignment control circuit 2. Bus IB comprises a number of signal lines at least equal to the number of signal lines of bus DAT, i.e., to the output data word size of the memory device. In this example, it is assumed that the memory device has an output data word with a size of sixteen bits, and consequently bus DAT and bus IB contain at least sixteen signal lines.

Bus IB runs through the semiconductor memory device chip. Each signal line of bus IB supplies a respective output buffer circuit OB which drives a respective output data terminal I/O of the memory device.

Also schematically shown in FIG. 1 is a group 3 of redundancy columns of redundancy memory cells provided in the memory device for functionally substituting columns of the memory matrix containing defective memory cells. The circuits within block 3 include redundancy column selection and sensing circuits, and a redundancy data signal line RD represents the output signal of the column redundancy sensing circuit carrying a datum memorized in a redundancy memory cell of the selected redundancy column and read by the redundancy sensing circuit, such circuits being well known in the art. Line RD is routed to the output buffer circuits OB of the memory device, where switches SW switch a data input of each output buffer circuit OB between the respective signal line of bus IB and the redundancy data signal line RD.

The memory device also comprises a column redundancy circuit 6 and a row redundancy circuit 7. The column redundancy circuit 6 is supplied with column address signals CADD which allow selection of columns of memory cells in the memory matrix. The column redundancy circuit 6 generates redundancy column selection signals (bus RCOL) for selecting the redundancy columns inside block 3, and matrix portion identifying signals (bus ROC) suitable for identifying the portion of the memory matrix to which the defective columns of memory cells belong.

The row redundancy circuit 7 is supplied with row address signals RADD which allow selection of rows of memory cells inside the matrix of memory cells, and generates redundancy row selection signals (bus RROW) for selecting the redundancy rows. The redundancy rows are within the same general block as the matrix 1 of memory cells.

The redundancy column selection signals (bus RCOL), in addition to allowing the selection of the redundancy columns, are interfaced, by means of tri-state interface circuits 8 (one interface circuit for each signal line of bus RCOL) to respective signal lines of a local shared bus LB1; similarly, the matrix portion identifying signals (bus ROC) are interfaced, by means of tri-state interface circuits 9 (one interface circuit for each signal line of bus ROC), to the signal lines of bus LB1. The signal lines of bus LB1 are interfaced, by means of interface circuits 10 (one for each signal line of bus LB1), to respective signal lines of the general-purpose shared bus IB.

The redundancy row selection signals (bus RROW), in addition to allowing the selection of the redundancy rows, are interfaced, by means of respective tri-state circuits 11 (one for each signal line of bus RROW), to respective signal lines of bus IB.

A redundancy control circuit 12 is also shown in FIG. 1. The redundancy control circuit 12, which is integrated in the region of the chip wherein the row and column redundancy circuits 7 and 6 are integrated, is supplied by several control signals CRCK, RRCK, REDCK, UGVSW, DMA, RES, PG, AD generated by a control logic 13 conventionally provided in memory devices for controlling the operation thereof The redundancy control circuit 12 is also supplied by the column redundancy circuit 6 with a column redundancy detection signal CR and with a column address configuration detection signal CALL1: signal CR is activated when one of the column redundancy selection signals of bus RCOL is activated (to indicated that the currently addressed column of the memory matrix is a defective column, and that a redundancy column is to be selected in substitution); signal CALL1 is activated when the current configuration of the column address signals CADD coincides with a default configuration (to be explained later on). Similarly, the redundancy control circuit 12 is supplied by the row redundancy circuit 7 with a row redundancy detection signal RR and with a row address configuration detection signal RALL1: signal RR is activated when at least one of the row redundancy selection signals of bus RROW is activated (to indicate that the currently addressed row of the memory matrix is a defective row, and that a redundancy row is to be selected in substitution); signal RALL1 is activated when the current configuration of the row address signals RADD coincides with a default configuration (to be explained later on). The redundancy control circuit 12 is also supplied by a signal line IB0 of bus IB, and with an internal timing signal EQ generated by a timing signal generator 14.

The redundancy control circuit 12 generates redundancy control signals (bus RCNT) which are interfaced, by means of respective tri-state interface circuits 15 (one for each signal line of bus RCNT), with the local shared bus LB1. The redundancy control circuit 12 also generates test signals (bus TCNT) controlling a test memory unit TMU. The test memory unit TMU has an output signal FTS which is also interfaced, by means of a respective tri-state circuit of group 15, with a respective signal line of the local bus LB1.

The activation of tri-state interface circuits 8, 9 and 15 is controlled by a bus assignment circuit 16 supplied with two control signals CRCK and ROCTR generated by the control logic 13 and with a second timing signal SND generated by the timing signal generator 14. Interface circuits 8 and 10 are controlled by respective signals CHK and LOC generated by circuit 16, interface circuits 9 and 15 are controlled by a common signal ROCE also generated by circuit 16.

The column and row redundancy circuits 6 and 7 and the redundancy control circuit 12 are normally formed in regions of the memory device chip which can be quite far away from the regions of the chip wherein the output buffer circuits OB are formed; however, some of the signals generated by the column and row redundancy circuits 6, 7 and by the redundancy control circuit 12 are to be used in the region of the chip containing the output buffer circuits, or are to be transferred to the output terminals I/O of the memory device, for example for test purpose. For example, the matrix portion identifying signals of bus ROC, which are generated by the column redundancy circuit, are to be transferred to the output buffer circuits OB to control the switch SW at the input of the output buffer OB associated to the memory matrix portion containing the defective column to switch from the respective signal line of bus IB to the redundancy data signal line RD. Also, for test purpose, it is useful to have the redundancy row selection signals RROW and the redundancy column selection signals RCOL drive the output terminals I/O of the memory device, to ascertain which redundancy row or redundancy column has been used to replace a defective row or column, and so on. Normally this involves routing of several dedicated signal lines from the region of the chip wherein the redundancy circuits are integrated to the region of the chip containing the output buffers and providing distribute control logic circuits, with significant occupation of chip area and complication of the layout design.

In the memory device of the present invention this problem is overcome thanks to the provision of the time-shared bus IB which is used not only to transfer the output signals of the sensing circuits of the matrix memory cells to the output buffers OB, but also to transfer several other signals, such as the column redundancy selection signals RCOL, the matrix portion identifying signals ROC and the row redundancy selection signals RROW from the region of the chip containing the redundancy circuits to the region containing the output buffers.

As will be explained in greater detailed in the following, bus IB is assigned to the different circuit blocks of the memory device according to a time-shared approach. This means that, during for example a read cycle of the memory device, bus IB will be assigned to a given circuit block of the memory device during a prescribed time interval, and to another circuit block of the memory device during another time interval. For this reason, some kind of memory buffer must be provided in the region of the chip containing the output buffers for storing data present on bus IB only for a prescribed time interval.

In FIG. 1 such memory buffer is represented by two memory registers 17 and 18. Code memory register 17 is supplied by a sub-set IB1 of signal lines of bus IB containing the signal lines of bus IB which can be assigned, by interface circuits 9 and 10, to the signal lines of bus ROC, and stores the matrix portion identifying code; memory register 17 must therefore comprise a number of memory units at least equal to the number of bits forming the matrix portion identifying code: for example, a four-bit code is sufficient to identify one matrix portion among sixteen. Configuration memory register 18 is supplied by another sub-set IB2 of signal lines of bus IB containing the signal lines of bus IB which can be assigned, by interface circuits 10 and 15, to the signal lines of the redundancy control signals bus RCNT and to the output signal FTS of the test memory unit TMU. Output signals of memory register 17 are transferred to a local bus LB2 of signal lines, which can be interfaced, by means of switches SW1 activated in a particular test mode, back to respective signal lines of bus IB. Output signals of memory register 18 are transferred to another local bus LB3 which can be retransmitted, by means of switches SW2 also activated in said particular test mode, back to the sub-set of signal lines IB2 of bus IB.

In the region of the chip containing the output buffers OB, a control circuit 19 is provided which is supplied by signal lines of bus LB3 carrying control signals RRCK and CRCK generated by the control logic 13, transferred to the chip region containing the output buffers by means of bus IB and stored in the configuration memory register 18. Circuit 19 is also supplied with the timing signal EQ and with a third timing signal PC generated by the timing signal generator 14, and with control signals REGTS and ROCTR generated by the control logic 13. Circuit 19 generates a signal LD controlling the memory registers 17 and 18, and a signal REGCK which controls the activation of switches SW1 and SW2 in the above-mentioned test mode to allow recirculation of the output signals of memory registers 17 and 18 on the signal lines of bus IB.

The control circuit 19 also generates a signal HL which controls a switch SW6. Switch SW6 connects a control signal OBC of the output buffers OB to a pulsed signal OBL generated by the timing signal generator 14 or to a voltage supply VDD. When signal HL is deactivated (low logic level), signal OBC is connected to the pulsed signal OBL which is activated substantially at the end of each read cycle of the memory device to allow the output buffers OB to load the data present at their data input (carried by the respective signal line of bus IB or, if the output buffer is associated to a matrix portion wherein the addressed column is defective, to the redundancy data signal RD). When instead signal HL is activated (high logic level), signal OBC is connected to VDD.

Also, in the chip region containing the output buffers OB, an identifying code decoder 38 is provided which is supplied, via signal lines of bus LB2, by the output signals of the code memory register 17. Circuit 38 is also supplied by a signal CRDET which is generated by the redundancy control circuit 12 and is part of bus RCNT, is transferred to the configuration memory register 18 via bus IB and is stored therein. Circuit 38 is further supplied by a control signal NODEC generated by the control circuit 19. The decoder 38 decodes the matrix portion identifying code generated by the column redundancy circuit 6, transferred to the code memory register 17 and stored therein, and activates one of sixteen decoded signals DEC1–DEC16 each one controlling the switch SW associated to a respective output buffer OB. However, when either signal NODEC is activated (high logic level) or signal CRDET is deactivated (high logic level) the decoder 38 is deactivated and all the decoded signals DEC1–DEC16 are kept at the low logic level.

Figure 2:
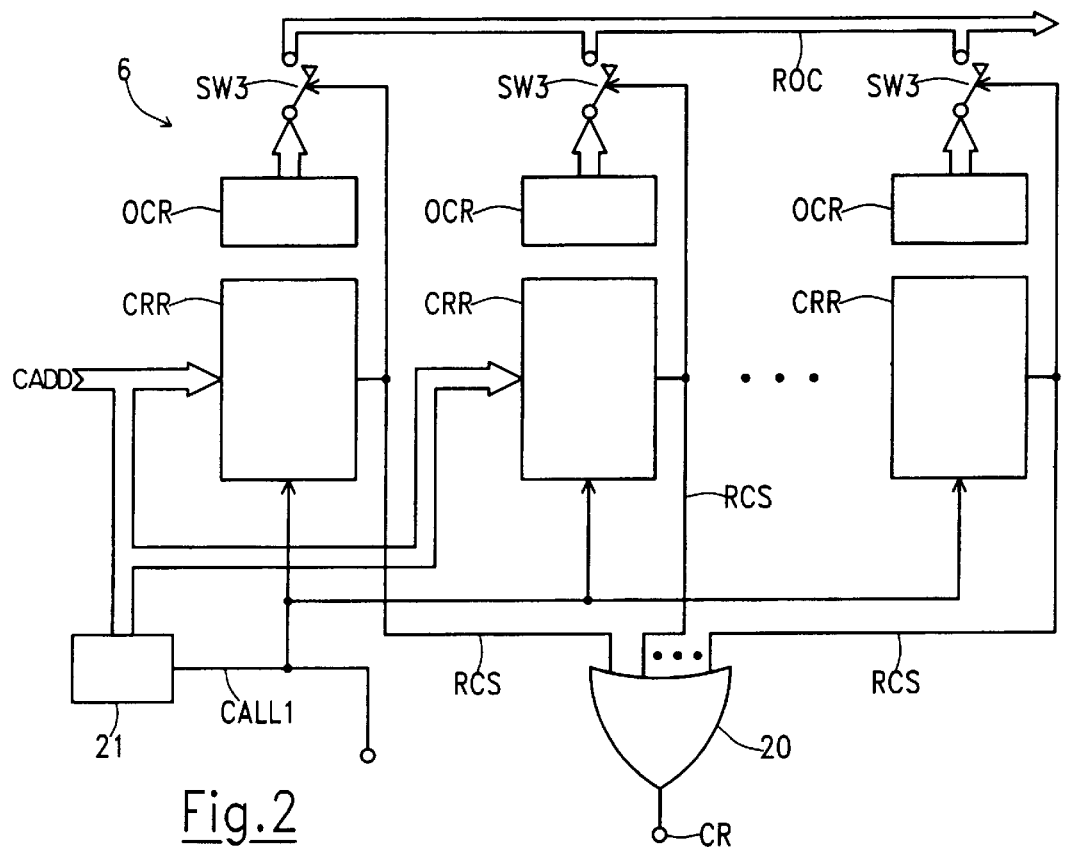
FIG. 2 is a schematic block diagram of a column redundancy circuit comprising a plurality of column redundancy memory registers for storing defective column addresses.

FIG. 2 schematically shows the column redundancy circuit 6. The circuit comprises a plurality of column defective address memory registers CRR (column redundancy registers) supplied by the column address signals CADD. Each column redundancy register CRR comprises a number of programmable non-volatile memory units (not shown) equal to the number of column address signals of bus CADD. Each column redundancy register can be programmed to store an address of a defective column of the memory matrix 1, and performs a comparison of the defective address stored therein with the current column address CADD; if coincidence is detected, a respective redundancy column selection signal RCS is activated to select one of the redundancy columns of group 3. The redundancy column selection signals RCS form the bus RCOL of FIG. 1.

To each column redundancy register CRR there is also associated a respective matrix portion identifying code memory register OCR which stores a digital code suitable for identifying the portion of the memory matrix wherein the defective column is located. If for example the memory device has an output data word of the size of sixteen bits, the memory matrix will be divided in sixteen portions and a four bit digital code will be necessary to identify the matrix portion to which the defective column belongs. The outputs of the memory registers OCR can be selectively coupled, by means of respective switches SW3 controlled by the respective redundancy column selection signal RCS, to the signal lines of bus ROC.

All the redundancy column selection signals RCS are also supplied to OR logic means 20 whose output signal is represented by signal CR. The column redundancy circuit also comprises a column address configuration detector circuit 21 supplied by the column address signals CADD which activates the column address configuration detection signal CALL1 when the current configuration of the column address signals CADD coincides with a default configuration stored in non-programmed memory registers CRR. Signal CALL1 is supplied to the memory registers CRR to prevent, when activated, the activation of the redundancy column selection signals RCS. This prevents the multiple selection of redundancy columns associated to non-programmed memory registers which, even if non-programmed, store said default configuration.

Figure 3:
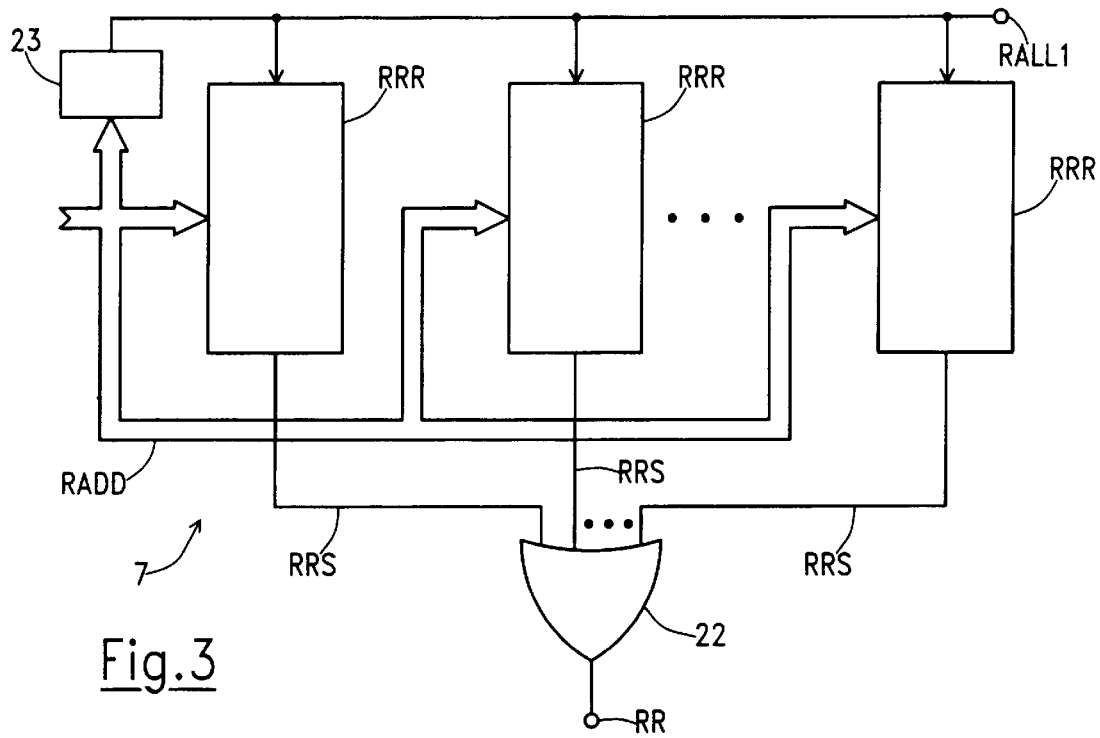
FIG. 3 is a schematic block diagram of a row redundancy circuit comprising a plurality of row redundancy memory registers for storing defective row addresses.

FIG. 3 schematically shows the row redundancy circuit 7. The circuit comprises a plurality of defective row address memory registers RRR (row redundancy registers) supplied with the row address signals of bus RADD. Each row redundancy register is made up by a number of programmable non-volatile memory units (identical to the memory units of the column redundancy registers) equal to the number of row address signals, and is capable of storing an address of a defective row in the memory matrix 1. The row redundancy registers RRR perform a comparison between the defective row address stored therein and the current row address supplied to the memory device, and activate respective redundancy row selection signals RRS when coincidence is detected. The redundancy row selection signals RRS allow the selection of the redundancy rows; all the redundancy row selection signals form bus RROW. All the redundancy row selection signals RRS supply OR logic means 22 which generates the signal RR, which is thus activated when one of the redundancy row selection signals RRS is activated. The row redundancy circuit also comprises a row address configuration detector 23 supplied by the row address signals RADD and generating the row address configuration detection signal RALL1. Signal RALL1 is activated when the current configuration of the row address signals RADD coincides with a default configuration stored in non-programmed memory registers RRR. Signal RALL1 also supplies all the memory registers RRR to prevent activation of the redundancy row selection signals RRS when the current row address configuration coincides with the default configuration. As in the case of the column redundancy circuit, this is necessary to prevent the selection of multiple redundancy rows associated to non-programmed memory registers RRR.

Figure 4:
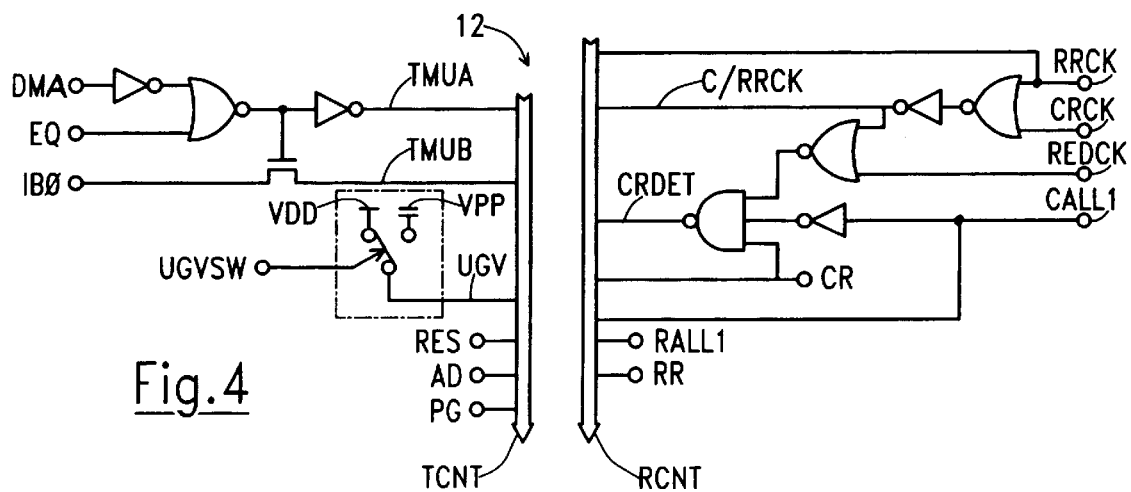
FIG. 4 is a circuit diagram of a redundancy control circuit.

FIG. 4 shows the redundancy control circuit 12. As visible, bus RCNT comprises seven signal lines, five of which are directly supplied by signals CR, CALL1, RR, RALL1 and by the control signal RRCK, respectively. The remaining two signal lines of bus RCNT are supplied by a signal C/RRCK which is activated (high logic level) when either one of control signals RRCK or CRCK is activated, and by a signal CRDET which is activated (low logic level)

when the signal CR is activated provided that signals CALL1, REDCK, RRCK and CRCK are all deactivated. Bus TCNT comprises six signal lines, three of which are directly supplied by signals RES, AD and PG. The remaining three signal lines of bus TCNT are respectively supplied by a signal TMUA which is activated (high logic level) when the control signal DMA and the timing signal EQ are both activated, by a signal TMUB which can be controlled by signal line IB0 of bus IB when signal TMUA is deactivated, and by a signal UGV which can be selectively made equal to a first voltage supply VDD (conventionally, the 5 V voltage supply which supplies all the logic circuits of the memory device) or to a second voltage supply VPP (typically, the 12 V voltage supply used to program the electrically programmable memory cells of the memory matrix 1), depending on the logic state of signal UGVSW.

Figure 5:
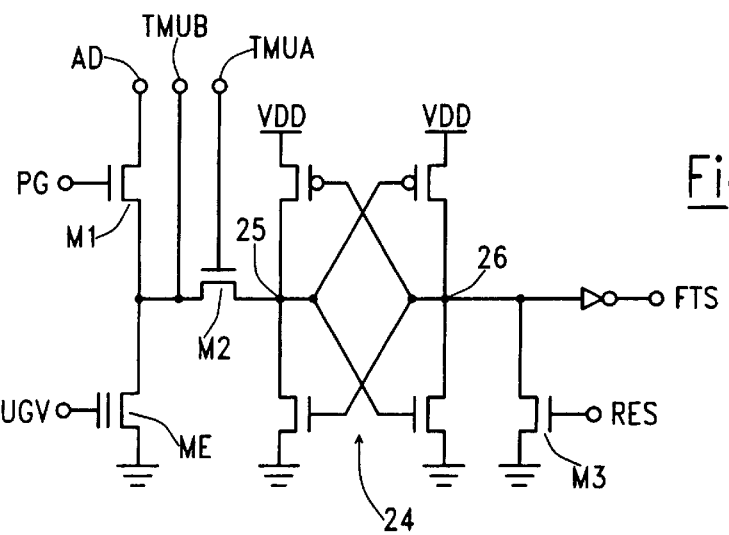
FIG. 5 is a circuit diagram of a test memory unit identical to memory units composing the row and column redundancy memory registers of the row and column redundancy circuits of FIGS. 2 and 3.

FIG. 5 shows the test memory unit TMU. The circuit is identical to the memory units of the column redundancy memory registers CRR and row redundancy memory registers RRR. It comprises a programmable non-volatile memory element ME such as a floating-gate MOS transistor with source connected to ground and drain connected, through a MOSFET M1 controlled by signal PG, to the signal line AD of bus TCNT. The drain of ME is also connected to signal line TMUB of bus TCNT and, through a pass MOSFET M2 controlled by signal TMUA of bus TCNT, to a set input 25 of a bistable latch 24. An output 26 of the bistable latch 24 forms, once logically inverted, the output signal FTS of the test memory unit. A reset MOSFET M3 controlled by signal RES of bus TCNT is inserted between the output 26 of bistable latch 24 and ground.

Figure 6:
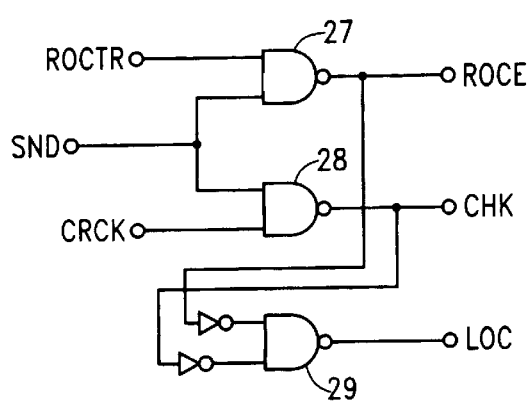
FIG. 6 is a diagram of a circuit for generating bus assignment signals for bus assignment interface circuits.

FIG. 6 shows the bus assignment circuit 16. The circuit comprises a first NAND gate 27 supplied by signals ROCTR and SND and generating signal ROCE controlling the activation of the interface circuits 9 and 15; a second NAND gate 28 supplied by signals CRCK and SND and generating signal CHK controlling the activation of the interface circuits 8; and a third NAND gate 29 supplied by the logic complements of signals ROCE and CHK and generating signal LOC controlling the activation of the interface circuits 10.

Figure 7:
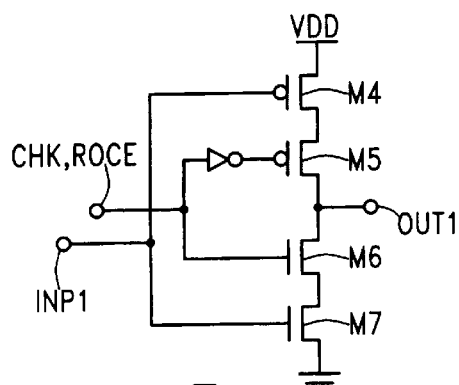
FIGS. 7 to 9 shows three different bus assignment interface circuits.

FIG. 7 shows one of the interface circuits of groups 8, 9 and 15. The circuit comprises four MOSFETs, two P-channel M4 and M5 and two N-channel M6 and M7, connected in series between VDD and ground. M4 and M7 are controlled by an input signal INP1 which represents one of the signal lines of buses RCOL, ROC or RCNT; M6 and M5 are controlled by the control signals CHK or ROCE and by the logic complement thereof, respectively. An output signal OUT1 represents one of the signal lines of bus LB1.

Figure 8:
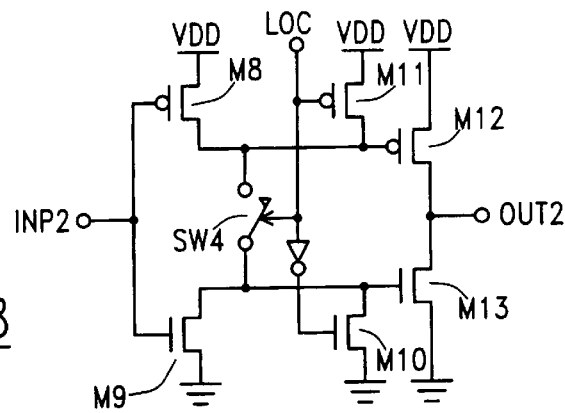

FIG. 8 shows one of the interface circuits 10. The circuit has an input signal INP2, representing one of the signal lines of bus LB1, controlling a P-channel MOSFET M8 and an N-channel MOSFET M9; M8 has a source connected to VDD, M9 has a source connected to ground; a drain of M8 can be coupled to a drain of M9 by means of a switch SW4 controlled by signal LOC. Signal LOC also controls, through an inverter, an N-channel MOSFET M10 with source connected to ground and drain connected to the drain of M9; signal LOC also controls directly a P-channel MOSFET M11 with source connected to VDD and drain connected to the drain of M8. The drains of M8 and M9 respectively control a P-channel MOSFET M12 and an N-channel MOSFET M13 connected in series between VDD and ground; a common node of M12 and M13 forms an output signal OUT2 of the interface circuit and is connected to a respective signal line of bus IB. When signal LOC is activated (low logic level), switch SW4 is closed, M10 and M11 are turned off, and the circuit behaves as a cascade of two inverters. When differently signal LOC is deactivated (high logic level), switch SW4 is open, M10 and M11 are turned on, M12 and M13 are turned off, and the output OUT2 is decoupled from the input INP2 of the interface circuit (i.e., the output of the interface circuit is in a high-impedance condition).

Figure 9:
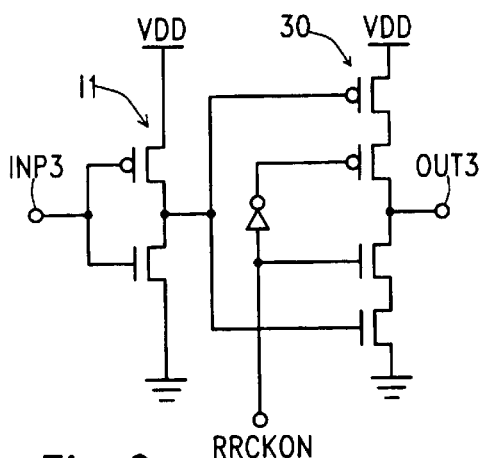

FIG. 9 shows one of the interface circuits 11. The circuit comprises a CMOS inverter I1 supplied by an input signal INP3 representing one of the redundancy row selection signals RROW; the output of I1 supplies a final stage 30 identical to the interface circuit shown in FIG. 7, the activation thereof being controlled by signal RRCKON. An output signal OUT3 of the final stage 30 supplies one of the signal lines of bus IB.

Figure 10:
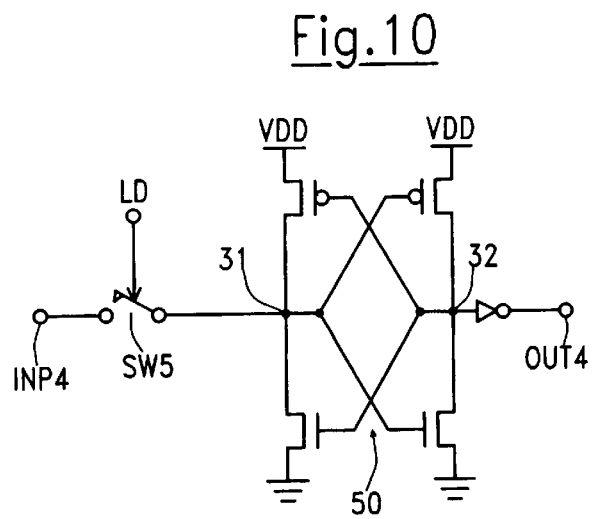
FIG. 10 is a circuit diagram of a memory unit of memory buffer means.

FIG. 10 shows the structure of a memory unit of the memory buffers 17 and 18 of FIG. 1. As previously stated, the proper number of memory units are provided corresponding to the number needed. In one embodiment, 4 bits must be stored so four memory units similar to the one shown in FIG. 10 are provided. More or fewer memory units can be provided as needed. The circuit has an input signal INP4 represented by one of the signal lines of buses IB1 or IB2. The input signal INP4 is supplied, by means of a switch SW5 controlled by a signal LD generated by the control circuit 19, to a set input 31 of a bistable latch 50. The bistable latch 50 has an output signal 32 which is supplied, through an inverter, to an output signal line OUT4. The output signal OUT4 represents one of the signal lines of bus LB2 or LB3.

Figure 11:
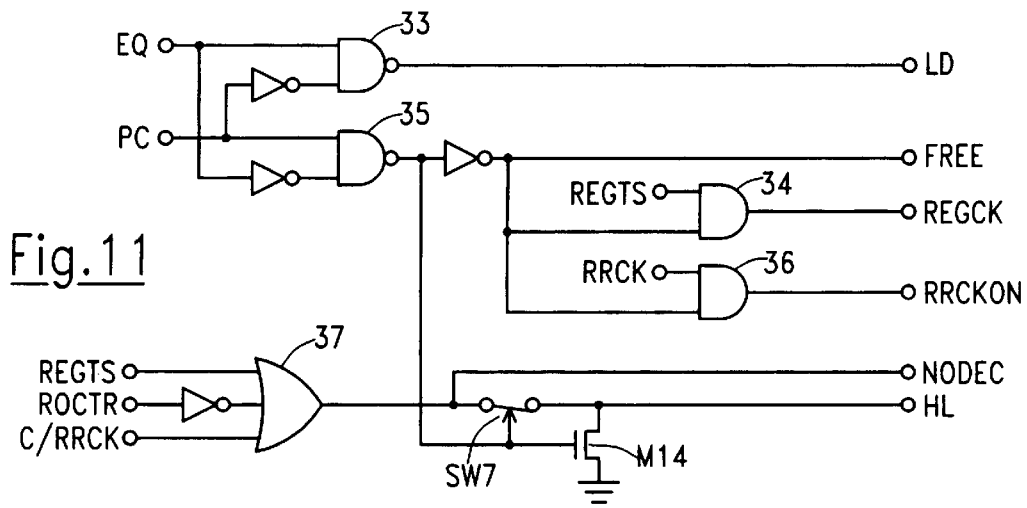
FIG. 11 is a diagram of a control circuit provided in a region of the semiconductor memory device chip wherein output data terminals of the memory device are integrated.

FIG. 11 shows the control circuit 19 of FIG. 1. The circuit generates the signal LD controlling switches SW5 in the memory units of the memory buffers 17 and 18; signal LD forms the output of an NAND gate 33 supplied with the timing signal EQ and with the logic complement of the timing signal PC. The circuit also generates the control signal REGCK which controls switches SW1 and SW2 of FIG. 1; signal REGCK forms the output of an AND gate 34 supplied with a control signal REGTS generated by the control logic 13 and with a logic complement FREE of an output signal of a NAND gate 35 supplied with the timing signal PC and the logic complement of the timing signal EQ. Signal FREE can also be used to indicate, when activated, that the shared bus IB is currently not assigned to any circuit block of the memory device. Signal FREE and signal RRCK supply an AND gate 36 whose output forms the signal RRCKON controlling the activation of the interface circuits 11 of FIG. 1. The circuit also comprises an OR gate 37 supplied by the control signal REGTS, by the logic complement of control signal ROCTR generated by the control logic 13 and by the signal C/RRCK. An output of OR gate 37 forms a control signal NODEC which is supplied to the identifying code decoder 38. Signal NODEC also supplies, through a switch SW7, the control signal HL. Switch SW7 is controlled by the output signal of NAND gate 35 which further controls an N-channel MOSFET connected between signal HL and ground. Even if one of signals REGTS, ROCTR or C/RRCK is activated, the activation of signal HL is conditioned by the timing signals EQ and PC.

Figure 12:
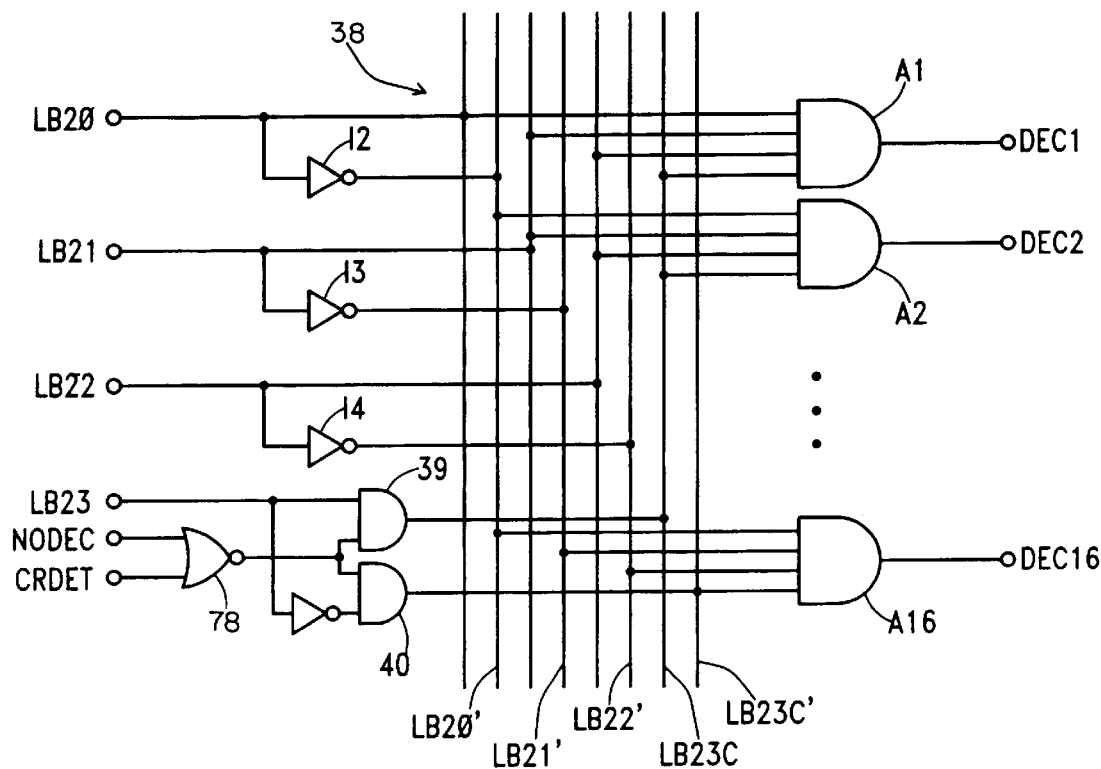
FIG. 12 is a diagram of a decoder circuit for decoding column redundancy information.

FIG. 12 shows the identifying code decoder 38. The circuit is supplied by the four signal lines LB20–LB23 of bus LB2 carrying the identifying code stored in the code memory register 17, by a signal line of bus LB3 carrying signal CRDET and by the control signal NODEC generated by the control circuit 19. The circuit comprises three inverters I2–I4 respectively supplied by signals LB20–LB22 and generating complemented signals LB20'–LB22'. Signals NODEC and CRDET supply a NOR gate 78; signal LB23 supplies an input of an AND gate 39 the other input of which is supplied by the output of NOR gate 78; a logic complement of signal LB23 supplies an input of an AND gate 40 the other input thereof is supplied by the output of NOR gate 78. Gate 39 generates a signal LB23C, and gate 40 generates a signal LB23C'. The circuit also comprises sixteen AND gates A1–A16, each one supplied by a respective unique combination of four of the eight signals LB20–LB22, LB20'–LB22', LB23C and LB23C'. Each AND gate A1–A16 generates an output signal forming one of the sixteen decoded signals DEC1–DEC16.

Figure 13:
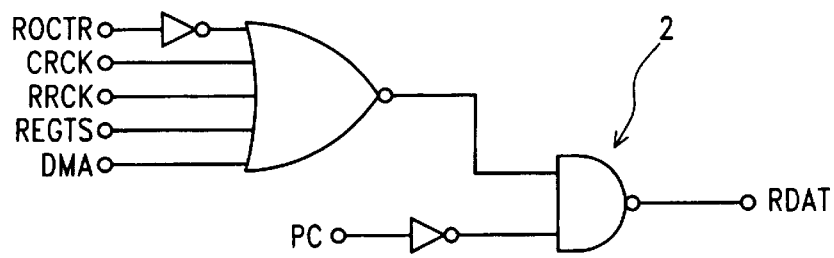
FIG. 13 is a diagram of a circuit for controlling another bus assignment interface circuit.

FIG. 13 shows the bus assignment control circuit 2 controlling the interface circuits 5. Signal RDAT which controls the activation of the interface circuits 5 is normally activated in each read cycle of the memory device according to signal PC. However, if one of signals ROCTR, CRCK, RRCK, REGTS or DMA is activated, the activation of signal RDAT is prevented, and the interface circuits 5 are kept in a high-impedance condition.

The operation of the memory device will be hereinafter described making reference to the timing diagram of FIG. 14. In this Figure, CY1 and CY3 indicate a normal read cycle of the memory device, while CY2 indicates a test cycle. A, B, C, D and E show the time evolution of some control signals in five different test operations of the memory device which can be performed in the test cycle CY2.

A read cycle or a test cycle of the memory device always starts when the column address signals CADD or the row address signals RADD change. Conventionally, an address transition detector detects the change in the address signal configuration supplied to the memory device and activates the address transition detection signal ATD: signal ATD, normally at the high logic level, goes to the low logic level for a prescribed time interval. The signal ATD is provided to the timing circuit 14. The high-to-low transition of signal ATD causes activation of signal PC, normally at the high logic level, that switches to the low logic level for a prescribed time interval, longer than that of signal ATD. Activation of signal ATD also causes the activation of signal EQ, normally at the low logic level, which switches to the high logic level for a prescribed time interval longer than that of signal PC. The timing circuit 14 is constructed using components known in the art in a known way to generate the signals on a timing pattern shown in FIG. 14. Using the timing chart of FIG. 14, and the description herein, the construction of circuit 14 is well within the skill of the art.

In the read cycle CY1 or CY3, the row address signals RADD are decoded to select a row of the memory matrix 1; the column address signals CADD are decoded to select a column inside each one of the sixteen portions of the memory matrix. In this way, sixteen memory cells of the memory matrix are simultaneously selected. The sensing circuits associated to the memory matrix read the data stored in the sixteen memory cells thus selected, and the read data are provided on the signal lines of bus DAT in FIG. 1. Simultaneously, the column redundancy circuit and the row redundancy circuit 6 and 7 compare the column address signals CADD and the row address signals RADD with the defective column address and the defective row address stored therein.

If the currently addressed row of the memory matrix is not defective, no one of the redundancy row selection signals of bus RROW is activated. Similarly, if the currently-addressed columns of the memory matrix are not defective, no one of the redundancy column selection signals of bus RCOL is activated.

If instead the currently-addressed row of the memory matrix is a defective row, one of the redundancy row selection signals RRS of bus RROW is activated to select one of the redundancy rows and to inhibit selection of the addressed defective row; activation of one of the redundancy row selection signals RRS (FIG. 3) determines the activation of signal RR. Similarly, if one of the currently-addressed columns of the memory matrix is defective, one of the redundancy column selection signals of bus RCOL is activated; activation of one of the redundancy column selection signals RCS (FIG. 2) causes the matrix portion identifying code which identifies the portion of the memory matrix wherein the defective column is located to be supplied to bus ROC, and signal CR to be activated.

Signal RR is supplied to a respective signal line of bus RCNT. Also, the activation of signal CR (since signals RRCK, CRCK, REDCK are deactivated because the current cycle is not a test cycle, and assuming that signal CALL1 is deactivated because the current configuration of the column address signals CADD does not correspond to the above-mentioned default configuration) causes the activation of signal CRDET, which is also supplied to a respective signal line of bus RCNT.

During a first part of the read cycle, when signal SND is at the low logic level, the bus assignment circuit 16 activates signals ROCE and LOC; when signal ROCE is activated (high logic level), the interface circuits 9 and 15 are activated (they exit the high-impedance condition), and the signals of buses ROC and RCNT, and signal FTS, are connected to respective signal lines of the local shared bus LB1; since moreover also signal LOC is activated (high logic level), the interface circuits 10 are activated, and the signal lines of local bus LB1 are connected to respective signal lines of the general-purpose shared bus IB. During this first part of the read cycle, the interface circuits 5 interfacing bus DAT to the shared bus IB are in a high-impedance condition (RDAT is deactivated). Signals ROCE and LOC, and thus interface circuits 9 and 15, remains activated until signal SND is activated. During this time interval, the identifying code signals of bus ROC, the signals of bus RCNT generated by the redundancy control circuit 12 and signal FTS generated by the test memory unit TMU are available on respective signal lines of bus IB.

As long as both signal PC and signal EQ are activated, the control circuit 19 activates signal LD, that allow the data present on the signal lines of bus IB to be loaded into the memory units of memory registers 17 and 18; more precisely, the matrix portion identifying code is loaded in the four memory units of memory register 17, while the signals of bus RCNT and signal FTS are loaded in respective memory units of memory register 18. When signal PC returns to the high logic level, signal LD is deactivated, and memory registers 17 and 18 are isolated from the signal lines of bus IB.

After signal PC is returned to the high logic level, interface circuits 5 are activated to couple the signal lines of bus DAT to respective signal lines of bus IB.

The content of the code memory register 17 is supplied to signal lines of the local bus LB2, which in turn supplies the identifying code decoder 38; the content of configuration memory register 18 is supplied to signal lines of local bus LB3; a signal line of bus LB3 carrying signal CRDET is supplied to the decoder 38. Since signals C/RRCK, TST and REGTS are deactivated because the current cycle is not a test cycle, signal NODEC is also deactivated; the decoder 38 is therefore enabled (signals LB23C and LB23C' respectively correspond to signal LB23 and to the logic complement thereof), and activates one of the sixteen decoded signals DEC1–DEC16. The output buffer OB whose respective decoded signal DEC1–DEC16 is activated will be supplied at its data input terminal by the redundancy data signal line instead of a respective signal line of bus IB. When signal OBC, which in this case is supplied by the timing signal OBL because signal HL is deactivated, is activated (high logic level pulse), the data present at the input of the output buffers OB are loaded in the output buffers which then drive the respective output terminals I/O.

Activation of signal REDCK inhibits the activation of signal CRDET even if one of the currently addressed columns is a defective one: in this case, decoder 38 is deactivated and all the decoded signals DEC1–DEC16 are kept deactivated.

Figure 14:
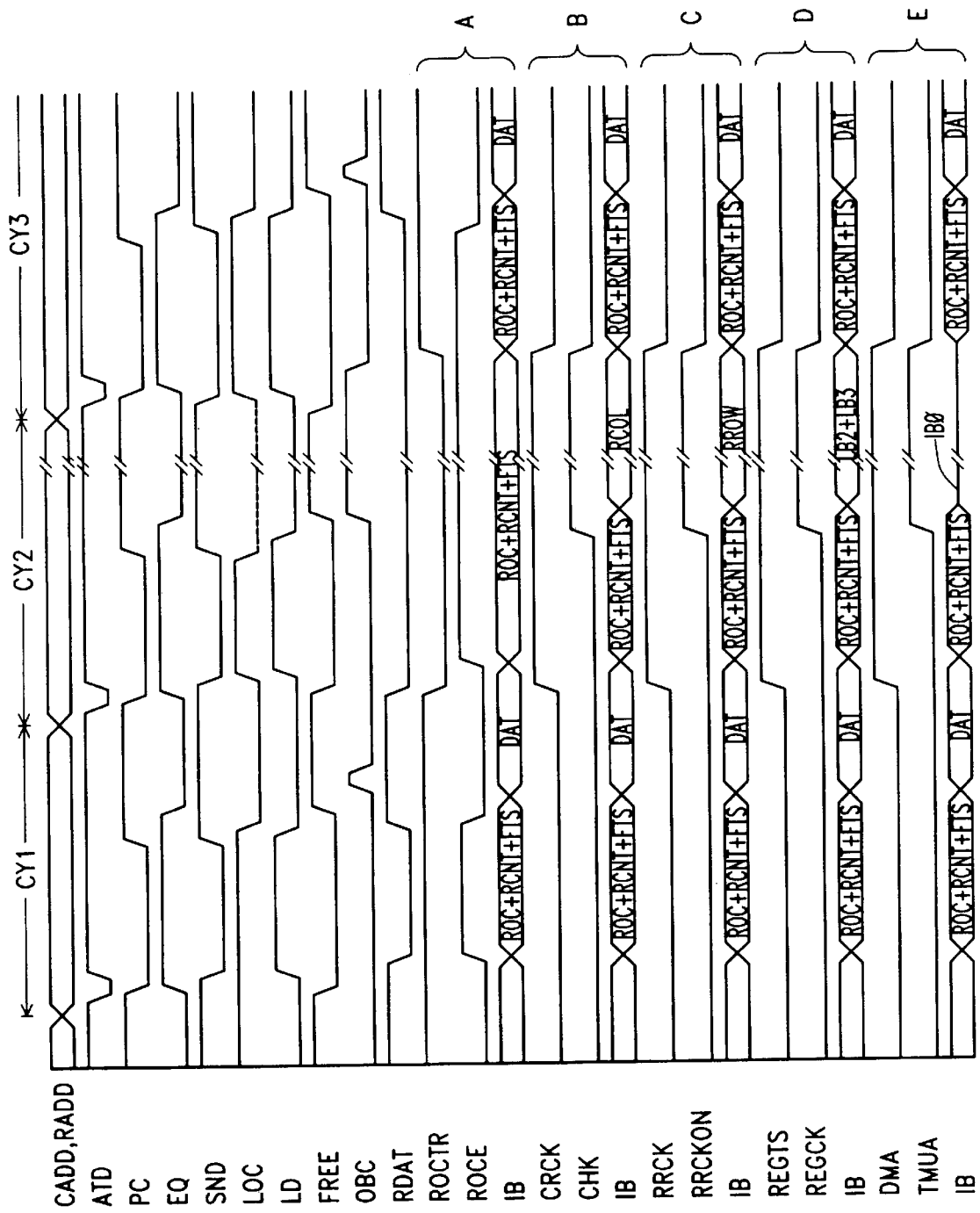
FIG. 14 is a timing diagram illustrating the time evolution of the most important signals in different operating modes of the memory device.

A first test mode, illustrated with A in the timing diagram of FIG. 14, is activated by the activation of signal ROCTR (low logic level). In this test mode, signal ROCE is kept activated for the entire duration of the test cycle CY2 and does not follow the timing of signal SND. The signal lines of buses ROC and RCNT and signal FTS are thus coupled to respective signal lines of the local bus LB1 for the entire duration of cycle CY2; also, signal LOC is kept activated for the entire duration of cycle CY2, thus signal lines of bus LB1 are coupled to respective signal lines of bus IB for the entire duration of cycle CY2; signal RDAT is instead kept deactivated so that interface circuits 5 do not connect bus DAT to bus IB. In other words, differently from a normal read cycle, in this test cycle the general-purpose time-shared bus IB is assigned for the whole duration of the test cycle to the column redundancy circuit 6 and to the redundancy control circuit 12. In this way, when the memory device is supplied with a particular configuration of row and column address signals, it is possible to read at the output terminals I/O of the memory device the logic state of signals RR, RALL1, CRDET, CALL1 and, if the column address supplied to the memory device corresponds to a defective column, the matrix portion identifying code which identifies the portion of the memory matrix wherein the defective column is located: if the addressed row is a defective one, signal RR will be activated; if one of the addressed column is defective, signal CRDET will be activated, and it will be possible to know the memory matrix portion to which the defective column belongs. It is to be noted that activation of signal ROCTR determines the activation of signal NODEC (FIG. 11) which inhibits the activation of the sixteen decoded signals DEC1–DEC16, and also causes, at the end of signals EQ and PC, the activation of signal HL which forces signal OBC to be supplied by VDD instead of the timing signal OBL: in this way, the output buffers OB can be loaded with the data present on the respective lines of bus IB not only during the short pulse of signal OBL, but in a longer time.

In this test mode it is also possible to perform several tests on the test memory unit TMU. It is, for example, possible to program the programmable memory element ME with a prescribed datum: the datum to be programmed is carried by signal AD, and it is necessary to activate signal PG to enable programming of memory element ME. The programmed datum is read and stored in the bistable latch 24, and appears at the output signal FTS. The programming margin of the memory element ME can also be verified by activating signal UGVSW to switch the control-gate voltage of memory element ME from the normal VDD supply voltage to the higher supply voltage VPP: if memory element ME is not well programmed, when its control gate voltage is raised to VPP it behaves as if it were non-programmed, and the logic level of signal FTS changes. It is also possible to force the bistable latch 24 in a predetermined condition, independently of the programming state of memory element ME, by activating signal RES.

A second test mode, illustrated with B in the timing diagram, is activated by activating signal CRCK; activation of signal CRCK determines the activation of signal C/RRCK (FIG. 4) and forces signal CRDET at the high logic level. Activation of signal CRCK also forces signals CHK and LOC to be activated independently of signal SND, so that the redundancy column selection signals of bus RCOL can be supplied to respective signal lines of bus IB. Furthermore, signal HL is activated, and signal OBC is thus supplied by VDD. It is thus possible to read at the output terminals I/O of the memory device the logic state of the redundancy column selection signals of bus RCOL. This test allows the determination of how many and which of the redundancy columns have been used to replace defective columns of the memory matrix. To this purpose, it is necessary to scan all the possible configurations of the column address signals: if the current column address corresponds to a defective column, a logic-state transition will be detected at one of the output terminals I/O. This test can be made faster by adopting the method described in the co-pending European Patent Application No. 96830216.6 filed on Apr. 18, 1996 in the name of the same Applicant.

A third test mode, illustrated with C in the timing diagram, is activated by activating signal RRCK; activation of signal RRCK determines the activation of signal C/RRCK (FIG. 4) and forces signal CRDET at the high logic level. The bus assignment circuit 16 operates as in a normal read cycle, thus in a first part of the test cycle bus IB is coupled to the signal lines of buses ROC and RCNT and to signal FTS. The data present on the signal lines of buses ROC and RCNT and the datum present on signal line FTS are thus transferred, in the first part of the test cycle, to the memory buffers 17 and 18. When signal EQ returns to the low logic level and signal PC returns to the high logic level (i.e., when bus IB is free), signal RRCKON is activated (FIG. 11) and the interface circuits 11 are activated, so that the redundancy row selection signals of bus RROW can be connected to respective signal lines of bus IB. Since signal C/RRCK is active, signal NODEC is activated (high logic level) and the decoder 38 is deactivated (no one of signals DEC1–DEC16 is activated). Signal HL is also activated, thus signal OBC is supplied by VDD. In this test mode it is possible to ascertain how many and which of the redundancy rows have been used to replace defective rows of the memory matrix; to this purpose it is sufficient to scan all the possible configurations of the row address signals RADD: if the current row address corresponds to a defective row, a logic-state transition will be detected at one of the output terminals I/O of the memory device. As in the previous test mode, this test can be made faster by adopting the method disclosed in the above-identified European Patent Application.

A fourth test mode, illustrated with D in the timing diagram, is activated by activating signal REGTS. During the first part of the test cycle, bus IB is again used, as in a normal read cycle, to transfer signals of buses ROC and RCNT and signal FTS, which are then stored in the memory buffers 17 and 18. However, activation of signal REGTS determines the activation, at the end of signals EQ and PC, of signal REGCK that makes switches SW1 and SW2 to close thus connecting the signal lines of buses LB2 and LB3 to respective signal lines of bus IB. Activation of signal REGTS also determines the activation of signal NODEC which inhibits the activation of the decoded signals DEC1–DEC16, and the activation of signal HL that determines signal OBC to be supplied by VDD. In this test mode, it is possible to read at the output terminals I/O of the memory device the content of the memory registers 17 and 18.

A fifth test mode, illustrated with E in the timing diagram, directly accesses the programmable memory element ME of the test memory unit TMU to perform a measure of its current-voltage characteristics. This test is activated by activating signal DMA. During the first part of the cycle, bus IB is used to transfer the data present on signal lines of buses ROC and RCNT and the datum of signal FTS. With reference to FIG. 4, when signal EQ returns to the low logic level, signal TMUA is activated (low logic level) and signal TMUB is connected to signal line IB0 of bus IB. Referring to FIG. 5, MOSFET M2 is thus kept off and the drain electrode of the memory element ME can thus be directly driven by signal line IB0 of bus IB. If switching means 100 controlled by signal DMA are provided to directly connect one of the output terminals I/O to signal line IB0 of bus IB, it is possible to externally supply the drain electrode of memory element ME with a variable voltage and to measure the amount of current sunk by memory element ME.

From the previous description it is apparent that each access cycle to the memory device, be it a normal read cycle or a test cycle, is substantially divided in two time intervals. The first time interval substantially corresponds to the time needed for the row and column selection signals to propagate from the address input buffers to the memory matrix and for the sensing circuits to read the selected memory cells. In conventional memory devices this time interval is wasted, because the read data are still not available. The second time interval corresponds to the part of conventional read cycles during which the read data are transferred from the sensing circuits to the output terminals of the memory device. Differently from conventional memory devices, this second time interval can be used to transfer other signals from the read data of the selected memory cells.

I claim:

1. A semiconductor memory device comprising:

redundancy memory elements for functionally replacing defective memory elements;

redundancy circuits for operating said functional substitution of the redundancy memory elements for the defective memory elements;

operation mode control circuits for controlling the memory device to operate according to a plurality of operation modes, said plurality of operation modes comprising at least a memory read mode and redundancy test modes for testing the redundancy circuits; and an internal shared bus of signal lines that, when the memory device is operated in said read mode, is used to transfer read data signals to output terminals of the memory device, and, when the memory device is operated in one of said redundancy test modes, is used to transfer redundancy signals, depending on the redundancy test mode, to output terminals of the memory device.

2. A semiconductor memory device comprising:

redundancy memory elements for functionally replacing defective memory elements;

redundancy circuits for operating said functional substitution of the redundancy memory elements for the defective memory elements;

operation mode control circuits for controlling the memory device to operate according to a plurality of operation modes, said plurality of operation modes comprising at least a memory read mode and redundancy test modes for testing the redundancy circuits;

an internal shared bus of signal lines that, when the memory device is operated in said read mode, is used to transfer read data signals to output terminals of the memory device, and, when the memory device is operated in one of said redundancy test modes, is used to transfer redundancy signals, depending on the redundancy test mode, to output terminals of the memory device;

a plurality of output data terminals;

a matrix of memory cells arranged in rows and columns, said columns being grouped in a plurality of groups of columns of memory cells, each group of columns being associated to a respective output data terminal;

row and column selection means for selecting a row and a column in each group of columns, and sensing means for sensing memory cells belonging to a selected row and to the selected columns and generating read data signals;

redundancy columns of redundancy memory cells for functionally replacing defective columns in said matrix;

a column redundancy circuit for storing defective column addresses of defective columns and identifying codes suitable for identifying the groups of columns wherein the defective columns are located, for comparing said defective column addresses with a current column address supplied to the memory device and for generating redundancy column selection signals for selecting a redundancy column when the current column address supplied to the memory device coincides with one of said defective column addresses;

redundancy rows of redundancy memory cells for functionally replacing defective rows in said matrix;

a row redundancy circuit for storing defective row addresses of defective rows, for comparing said defective row addresses with a current row address supplied to the memory device and for generating redundancy row selection signals for selecting a redundancy row when the current row address supplied to the memory device coincides with one of said defective row addresses;

wherein the internal shared bus comprises a time-shared bus including a plurality of signal lines provided in the memory device for interconnecting a plurality of circuit blocks of the memory device and for transferring signals between said circuit blocks, the time-shared bus being selectively assignable to said circuit blocks in respective prescribed time intervals;

first bus assignment means activated during a first time interval of an access cycle of the memory device for assigning the time-shared bus to the column redundancy circuit for transferring the identifying code of an addressed defective column from the column redundancy circuit to the output data terminals; and second bus assignment means for alternatively assigning the time-shared bus, during a second time interval of said access cycle, to said sensing means for transferring the read data signals to the output data terminals, to the column redundancy circuit for transferring the redundancy column selection signals to the output data terminals, or to said row redundancy circuit for transferring the row redundancy selection signals to the output data terminals, depending on an operating mode of the memory device.

3. The semiconductor memory device according to claim 2, wherein said second bus assignment means comprise first tri-state interface means activating during said second time interval for supplying said read data signals to the time-shared bus, second tri-state interface means activating during said second time interval for supplying the redundancy column selection signals to the time-shared bus, and third tri-state interface means activating during said second time interval for supplying the row redundancy selection signals to the time-shared bus.

4. The semiconductor memory device according to claim 2, wherein said first bus assignment means comprise a first tri-state interface circuit activating to couple signals carrying said identifying code to a local shared bus provided in a region of the memory device chip wherein the row and column redundancy circuits are integrated, and a second tri-state interface circuit activating to couple the local shared bus to the time-shared bus.

5. The semiconductor memory device according to claim 3, wherein said second tri-state interface means comprise a third tri-state interface circuit activating to couple the redundancy column selection signals to said local shared bus, and said second tri-state interface circuit activating to couple the local shared bus to the time-shared bus.

6. The semiconductor memory device according to claim 2, wherein said time-shared bus supplies first memory buffer means provided in a region of the memory device chip containing said output data terminals for storing the identifying code of the addressed defective column during said first time interval, said first memory buffer means supplying identifying code decoder means for decoding the identifying code to determine the group of columns to which the addressed defective column belongs, and for accordingly controlling the output data terminal associated to said group of columns to be supplied with a redundancy read data signal generated by redundancy sensing means associated to said redundancy columns.

7. The semiconductor memory device according to claim 3, further comprising third bus assignment means activated during said first time interval of the access cycle for transferring on the time-shared bus, together with said identifying code, redundancy control signals.

8. The semiconductor memory device according to claim 7, wherein said third bus assignment means comprise a fourth tri-state interface circuit activating to couple the redundancy control signals to said local shared bus, and the second tri-state interface circuit activatable for coupling the local shared bus to the time-shared bus.

9. The semiconductor memory device according to claim 8, further comprising second memory buffer means provided in said region of the chip containing the output data terminals for storing said redundancy control signals.

10. The semiconductor memory device according to claim 9, further comprising fourth bus assignment means activated in a first test operating mode for transferring, during said second time interval of the access cycle of the memory device, output signals of said first and second memory buffer means to said time-shared bus so that a content of said first and second memory buffer means can be supplied to said output data terminals.

11. The semiconductor memory device according to claim 10, wherein in a second test operating mode, said first and third bus assignment means are kept activated during both said first and second time intervals of the access cycle of the memory device so that said identifying code and said redundancy control signals can be supplied to said output data terminals.

12. The semiconductor memory device according to claim 2, wherein said first time interval is substantially equal to a time delay between the supply of the memory device with row address signals and column address signals and a delivery of said read data signals by said sensing means, and said second time interval corresponds to a time delay needed for transferring said read data signals from the sensing means to the output data terminals.

13. A memory device comprising:
a matrix of memory cells arranged in rows and columns;
a plurality of output terminals;
a plurality of redundant memory cells;
a memory operation mode control circuit within the memory device and structured to switch modes of operation of the memory device, the modes including at least a read mode and a test mode; and
a time-shared bus coupled to the memory cells, the redundant memory cells, and to the output terminals, the time-shared bus being structured to provide data read from the matrix to the output terminals when the memory device is in the read mode, and being structured to provide data other than data read from the memory cells to the output terminals when the memory device is in the test mode.

14. The memory device of claim 13 further comprising a row redundancy circuit structured to substitute some of the redundant cells into the matrix for an unacceptable row of memory cells.

15. The memory device of claim 13 further comprising a tristate interface circuit for placing data on the time-shared bus.

16. A method of providing data to a plurality of output terminals of a semiconductor memory circuit, the method comprising:
reading data from memory cells in the memory circuit;
placing data read from memory cells in the memory circuit onto a time-shared bus during a read mode cycle while blocking test data from being placed on the bus;
sensing test data from redundancy circuits; and
placing test data sensed from redundancy circuits onto the time-shared bus during a test mode cycle while blocking data read from memory cells from being placed on the bus.

17. The method of claim 16, further including the step of coupling the shared bus signals to the output terminals.

18. The method of claim 16, wherein the test data placed on the time-shared bus includes column redundancy signals sensed from a column redundancy circuit, the column redundancy signals encoding redundant columns used in the semiconductor memory circuit.

* * * * *